US012439528B2

(12) United States Patent
Reents et al.

(10) Patent No.: US 12,439,528 B2
(45) Date of Patent: *Oct. 7, 2025

(54) METHOD OF PREPARING A HIGH DENSITY INTERCONNECT PRINTED CIRCUIT BOARD INCLUDING MICROVIAS FILLED WITH COPPER

(71) Applicant: Atotech Deutschland GmbH & Co. KG, Berlin (DE)

(72) Inventors: Bert Reents, Berlin (DE); Akif Özkök, Berlin (DE); Soungsoo Kim, Berlin (DE); Horst Brüggmann, Berlin (DE); Herwig Josef Berthold, Berlin (DE); Marcin Klobus, Berlin (DE); Thomas Schiwon, Berlin (DE); Marko Mirkovic, Berlin (DE)

(73) Assignee: Atotech Deutschland Gmbh & Co. KG, Berlin (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/746,837

(22) Filed: Jun. 18, 2024

(65) Prior Publication Data

US 2024/0341042 A1    Oct. 10, 2024

Related U.S. Application Data

(63) Continuation of application No. 17/636,502, filed as application No. PCT/EP2020/073186 on Aug. 19, 2020, now Pat. No. 12,245,383.

(30) Foreign Application Priority Data

Aug. 19, 2019 (EP) .................................. 19192196

(51) Int. Cl.
H05K 3/42       (2006.01)
C25D 3/38       (2006.01)
(Continued)

(52) U.S. Cl.
CPC .............. *H05K 3/425* (2013.01); *C25D 3/38* (2013.01); *C25D 5/022* (2013.01); *C25D 5/18* (2013.01);
(Continued)

(58) Field of Classification Search
None
See application file for complete search history.

(56) References Cited

U.S. PATENT DOCUMENTS 5,976,341 A    11/1999  Schumacher et al.
6,099,711 A *   8/2000  Dahms ................... C25D 5/627
                                                        205/292
(Continued)

FOREIGN PATENT DOCUMENTS

EP    0952762 A1    10/1999
EP    2645830   *    2/2013 ............... H05K 3/42
WO    2010094998 A1  8/2010

OTHER PUBLICATIONS

PCT/EP2020/073186; International Search Report and Written Opinion of the International Searching Authority dated Oct. 16, 2020.

*Primary Examiner* — Jiong-Ping Lu
(74) *Attorney, Agent, or Firm* — Renner, Otto, Boisselle & Sklar, LLP

(57) ABSTRACT

The present invention refers to a method of preparing a high density interconnect printed circuit board (HDI PCB) or IC substrates including through-holes and/or grate structures filled with copper, which comprises the steps of:
  a) providing a multi-layer substrate;
  b) forming a non-copper conductive layer or a copper layer on the cover layer and on an inner surface of the through-hole, respectively on an inner surface of the grate structure;

(Continued)

c) forming a patterned masking film;
d) electrodepositing copper;
e) removing the masking film; and
f) electrodepositing a copper filling.

13 Claims, 2 Drawing Sheets

(51) Int. Cl.
- *C25D 5/02* (2006.01)
- *C25D 5/18* (2006.01)
- *C25D 5/34* (2006.01)
- *C25D 5/48* (2006.01)
- *C25D 7/00* (2006.01)
- *H01L 21/48* (2006.01)
- *H01L 21/768* (2006.01)
- *H05K 3/10* (2006.01)
- *H05K 3/46* (2006.01)
- *H05K 3/18* (2006.01)

(52) U.S. Cl.
CPC ............... *C25D 5/34* (2013.01); *C25D 5/48* (2013.01); *C25D 7/00* (2013.01); *H01L 21/4857* (2013.01); *H01L 21/76877* (2013.01); *H05K 3/108* (2013.01); *H05K 3/423* (2013.01); *H05K 3/429* (2013.01); *H05K 3/4623* (2013.01); *H05K 3/181* (2013.01); *H05K 2203/0353* (2013.01); *H05K 2203/072* (2013.01); *H05K 2203/0723* (2013.01); *H05K 2203/1492* (2013.01)

(56) References Cited

U.S. PATENT DOCUMENTS

| | | |
|---|---|---|
| 6,835,895 B1 | 12/2004 | Asai et al. |
| 2001/0023830 A1 | 9/2001 | Inoue et al. |
| 2007/0163887 A1 | 7/2007 | Hofmann |
| 2009/0145652 A1* | 6/2009 | En ................... C23C 28/42 |
| | | 174/265 |
| 2009/0301889 A1 | 12/2009 | Reents et al. |
| 2015/0289387 A1* | 10/2015 | Mirkovic ................ C25D 3/38 |
| | | 205/103 |

* cited by examiner

METHOD OF PREPARING A HIGH DENSITY INTERCONNECT PRINTED CIRCUIT BOARD INCLUDING MICROVIAS FILLED WITH COPPER

CROSS-REFERENCE TO RELATED APPLICATION

This application is continuation of U.S. application Ser. No. 17/636,502, filed 18 Feb. 2022, now U.S. Pat. No. 12,245,383, which was filed as a U.S. national phase of International Application No. PCT/EP2020/073186 filed 19 Aug. 2020, which claims priority to European Patent Application No. 19192196.4 filed 19 Aug. 2019, the entire disclosures of each of which are hereby incorporated by reference.

FIELD OF THE INVENTION

The present invention relates to manufacturing sequences for high density interconnect printed circuit boards (HDI PCB) and a high density interconnect printed circuit board obtained by the manufacturing sequence.

TECHNOLOGICAL BACKGROUND

At present high density interconnect printed circuit boards (HDI PCB) are manufactured by means of methods such as subtractive process, Semi-Additive Process (SAP), modified Semi-Additive Process (mSAP) or advanced modified Semi Additive Process (amSAP). In particular, mSAP and amSAP constitute promising variations for manufacturing the next generation of HDI PCBs allowing ultra fine microvia structures, line/space width ≤30 μm (L/S) and therefore providing higher complexity of interconnection.

Conventional mSAP sequences start with a copper clad substrate, wherein the copper cover layers may be 3 to 9 μm thick and the substrate includes single- or double-sided blind microvias (BMV). The first step of the process is an electroless deposition of copper, distributing a thin metal seed layer (0.35 to 0.6 μm) on the peripheral surface of the copper clad substrate and the inner surface of the microvia in order to provide a conductive base for the subsequent electrodeposition step. Subsequent electrodeposition of ~3 μm flash copper constitutes the first copper layer and results in partially filled microvias. Laminating a patterned dry film (mask) in the next step defines the negative of the line pattern (conductive traces); i.e. the patterned dry film defines the spacing areas between the conductive traces of the final PCB. In the following step, the substrate is processed in a second electrodeposition step using specific microvia-filling electrolytes. Subsequent removing of the dry film, however, reveals that the use of such specific electrolytes in the previous step will yield in unfavourable copper thickness variations between the microvia pad (outer end of the microvia) and the patterned copper surfaces, which in turn results in difficulties in the subsequent etching step. At last, the trace to trace separation will be realized by complete etching of the first and second copper layer as well as the seed and cover layer in the areas previously defined by the dry film.

US 2007/0163887 A1 describes a method of manufacturing a circuit carrier comprising, after providing a printed circuit board, coating the circuit board on at least one side thereof with a dielectric, structuring the dielectric for producing trenches and vias therein using laser ablation. Next, a primer layer is deposited onto the dielectric, either onto the entire surface thereof or into the produced trenches and vias only. A metal layer is deposited onto the primer layer, with the trenches and vias being completely filled with metal for forming conductor structures therein. Finally, the excess metal and the primer layer are removed until the dielectric is exposed if the primer layer was deposited onto the entire surface thereof, with the conductor structures remaining intact.

As the L/S separation decreases due to constant demand of ever decreasing trace width, the removal of the excess copper becomes an increasingly complex problem. In particular, the formation of thick copper layers with uneven copper layer surfaces is problematic. Since there has always been a tendency to "over etch" in order to accommodate plated copper thickness variations and ensure a clean trace to trace separation, with traces <30 μm in width there is serious risk of unacceptable width reduction as well as undercut. In consequence, a reduction of the layer thickness of the copper layers as well as decreased thickness variations is a desirable object of the present invention in order to reduce the mentioned risks during the etching process.

SUMMARY OF INVENTION

The present invention refers to a process of making a high density interconnect printed circuit board with microvias filled with electroplated copper.

Embodiments of the present disclosure seek to solve at least one of the problems existing in the prior art to at least some extent.

According a first aspect of the present disclosure, there is provided a method of preparing a high density interconnect printed circuit board (HDI PCB) including microvias filled with copper as defined in claim 1. The method comprises the steps of:
 a1) providing a multi-layer substrate comprising
  (i) a stack assembly of an electrically conductive interlayer embedded between two insulating layers having a peripheral surface,
  (ii) a cover layer covering the peripheral surface of the insulating layers of the multi-layer substrate, and
  (iii) a microvia extending from the peripheral surface of the multi-layer substrate through the cover layer and ending on the conductive interlayer;
 b1) depositing a conductive layer on the cover layer and on an inner surface of the microvia; or
 a2) providing a multi-layer substrate comprising
  (i) a stack assembly of an electrically conductive interlayer embedded between two insulating layers having a peripheral surface,
  (ii) a microvia extending from the peripheral surface of the insulating layers of the multi-layer substrate and ending on the conductive interlayer;
 b2) depositing a conductive layer on the peripheral surface of the insulating layers of the multi-layer substrate and on an inner surface of the microvia;
 and
 c) electrodepositing a copper filling in the microvia and a first copper layer on the conductive layer wherein a thickness of the first copper layer is from 0.1 to 3 μm and wherein the copper filling and the first copper layer form together a planar surface.

With the present invention a reduction of the layer thickness of the formed copper layer as well as decreased thickness variations is achieved wherein the above mentioned risks during a subsequent etching process is reduced. This is made possible because only microvias are formed within the insulating layers without forming trenches. Or with other words, according to claim 1, step a1) iii) only a microvia extending from the peripheral surface of the multi-layer substrate through the conductive cover layer and ending on the conductive interlayer, wherein no other structures as trenches to be filled extending from the peripheral surface of the multi-layer substrate through the conductive cover layer and insulating layer. Same applies for claim 1, step a2) ii) only a microvia extending from the peripheral surface of the insulating layers of the multi-layer substrate and ending on the conductive interlayer, wherein no other structures as trenches to be filled extending from the peripheral surface of the insulating layers of the multi-layer substrate.

These microvias are filled and an even copper layer is formed over the whole substrate. Subsequently the copper layer can be patterned in order to form conductive lines onto the insulating layers.

According to another aspect of the present invention, a high density interconnect printed circuit board (HDI PCB) including microvias filled with copper is provided, wherein the HDI PCB is obtained by the method described above.

Further aspects of the present invention could be learned from the dependent claims or the following description.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE INVENTION

Figure 1:
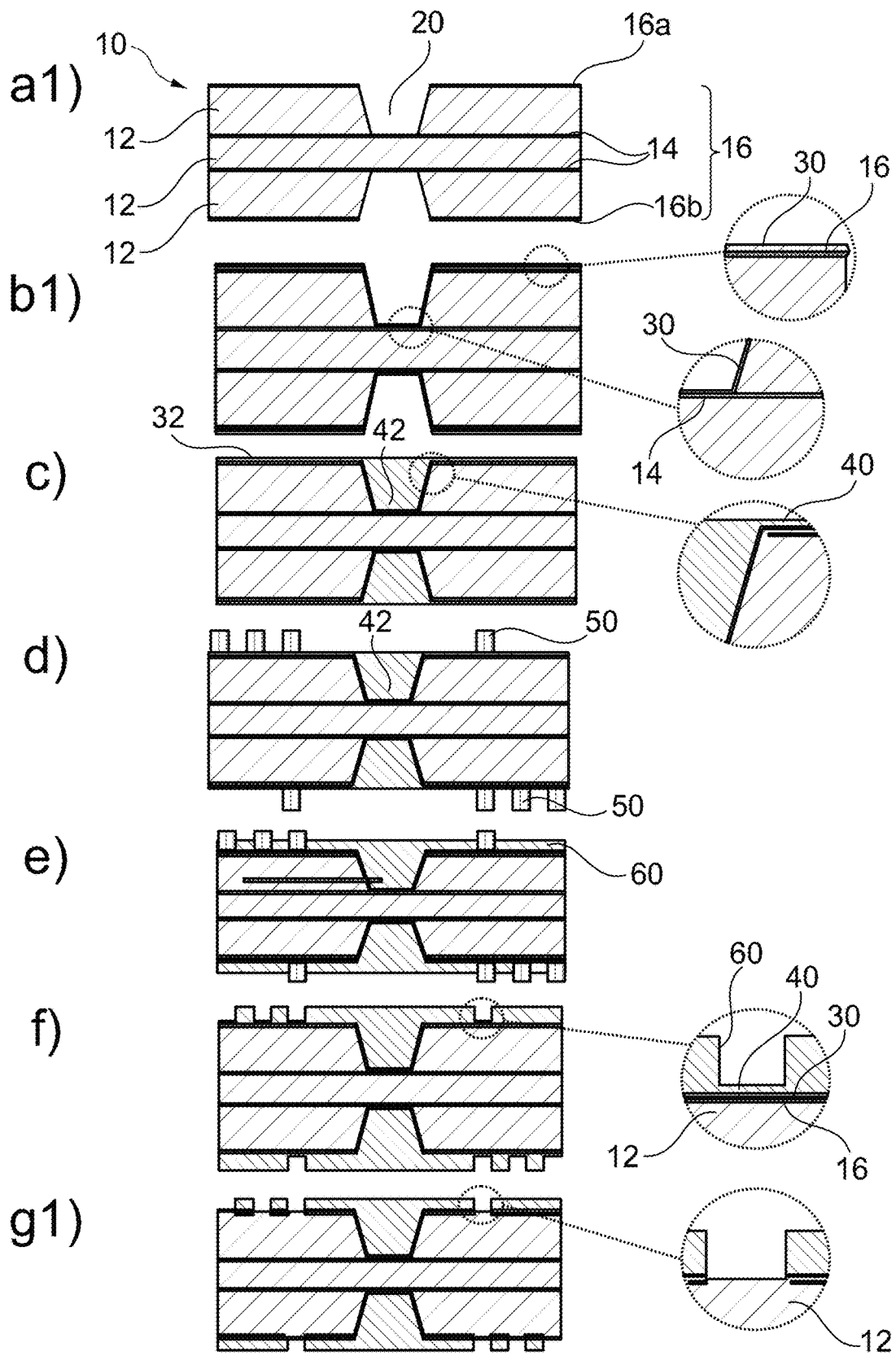
FIG. 1 illustrates a schematic sequence including cross sectional views of each step a1) to g1) of the method according to a first embodiment of the present invention.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention."

In the following description of embodiments of the present invention, the terms of a singular form may include plural forms unless the context clearly indicates otherwise.

In the drawings, the sizes of elements may be exaggerated for clarity. For example, in the drawings, the size or thickness of each element may be arbitrarily shown for illustrative purposes, and thus the embodiments of the present invention should not be construed as being limited thereto.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein.

Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present disclosure may not be described.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value. Further, the use of "may" when describing embodiments of the present invention refers to "one or more embodiments of the present invention." Herein, the terms "upper" and "lower" are defined according to the z-axis. For example, the cover is positioned at the upper part of the z-axis, whereas the ground plate is positioned at the lower part thereof.

The term "peripheral surface" of a layer or of the multi-layer substrate refers to the outermost surface of a layer or of a multi-layer substrate, which can be covered by additional layers during the following process steps. If the peripheral surface of a layer or of the multi-layer substrate is covered by an additional layer than the outermost surface of this additional layer becomes the next peripheral surface.

The term "electrically conductive interlayer" refers to an inner layer of the multi-layer substrate, wherein both surfaces of this interlayer are covered by two insulating layers (with their "inner" surfaces) having a peripheral surface (opposite to the "inner" surface). In case, there are two interlayers both surfaces of each interlayer are covered by insulating layers (two interlayers are embedded between three insulating layers), wherein the outermost insulating layers having a peripheral surface. In this case the most inner insulating layer (covered by two electrically conductive interlayers) can have a microvia or not. In case, the most inner insulating layer has a microvia, the microvia extends from the peripheral surface of the multi-layer substrate through the conductive cover layer through (outermost) insulating layer, through one conductive interlayer 14, through the next insulating layer and ending on the other conductive interlayer.

Figure 2:
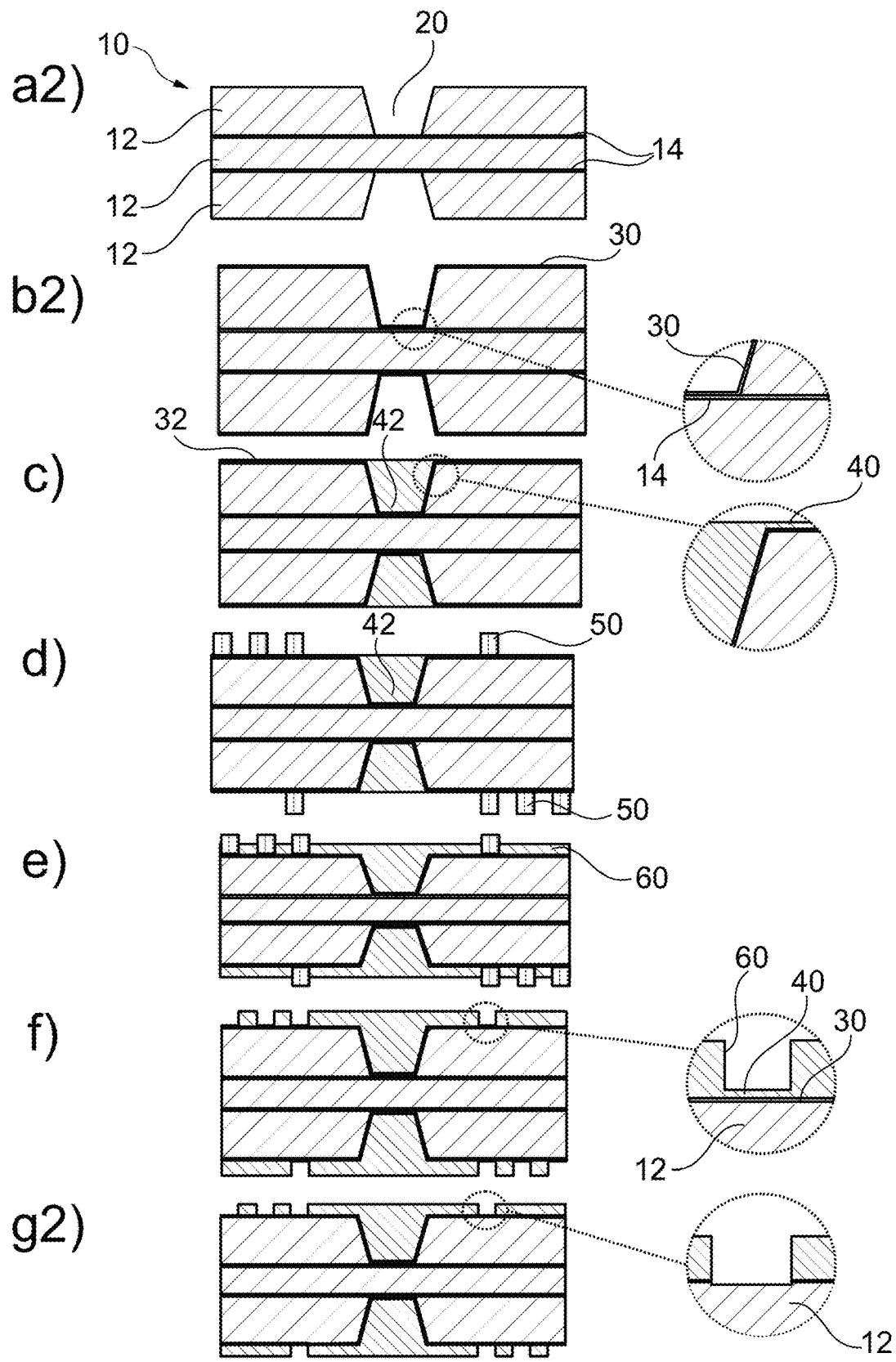
FIG. 2 illustrates a schematic sequence including cross sectional views of each step a2) to g2) of the method according to a second embodiment of the present invention.

As used herein, the term "thickness of the first copper layer" refers to the thickness of a copper layer formed in step c). The values of the thickness of the first copper layer as graphically shown in FIGS. 1 and 2 is normally much smaller than the thickness of a filled microvia. The value of the thickness of the first copper layer refers to the thickness of the copper layer which is located above the peripheral surface of the insulating layers which does not contain a microvia. The copper filling of step c) leads to a very thin thickness of the first copper layer and high quality filled microvias without plating errors as voids, wherein the formed surface of the first copper layer and filled microvias is very planar. In other words, there is no significant difference in heights between the peripheral surface of the copper filling and the copper layer.

The height difference of the formed planar surface in step c) between the copper filling and the first copper layer is less than 30% or less than 10% or from 10% to 30%. With other words, the height difference between the peripheral surface of the copper filling and the first copper layer is in particular less than 30%, preferred less than 10%. In one embodiment the difference is from 10% to 30%. The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In general, HDI PCBs offer the finest trace structures, the smallest holes and blind and buried vias (microvias). HDI technology thus allows a highly compact, reliable PCB design to be achieved using via-in-pads and multiple microvia layers (stacked and staggered vias). By pressing further layers using SBU (Sequential Build Up) or SSBU (Semi Sequential Build Up) technology, signals on the conductive interlayers can be connected and unbundled. This leaves space on the outer layers for components with a high pin density. IPC standards define HDI circuit boards by means of microvias≤0.15 mm and track width/distance≤0.1 mm, e.g. line to space ratios of 10/10 µm, 5/5 µm down to 2/2 µm.

The HDI layers may be built up from a double-sided core board or multilayer PCB. The HDI layers may be built on both sides of the PCB. The SBU/SSBU process consists of several steps: layer lamination, via formation, via metallization, and via filling. There are multiple choices of materials and/or technologies for each step. In particular, microvias can be filled with different materials and processes. However, stacked microvias are usually filled with electroplated copper to make electrical interconnections between multiple HDI layers and provide structural support for the outer levels of the microvias or for a component mounted on the outermost copper pad. The present invention refers to a manufacturing sequence where the microvias are filled with copper.

A blind microvia connects exactly one outer layer with one or more conductive interlayers. The blind microvia may end on an interlayer. The aspect ratio of a blind microvia shall be ≤2, preferred 1-2, more preferred ≤1 (ratio of hole depth to hole diameter). A preferred depth of the microvia is from 30-3000 µm and the preferred diameter is from 30-3000 µm. A buried via is a microvia between at least two interlayers that is not visible from the outer layers. This technology enables more functionality to be accommodated on a smaller PCB surface area (packing density).

FIG. 1 illustrates a schematic sequence including cross sectional views of the method according to a first embodiment of the present invention.

The inventive method of preparing a high density interconnect printed circuit board (HDI PCB) including microvias filled with copper according to the first embodiment comprises the steps of:

a1) providing a multi-layer substrate 10 comprising
  (i) a stack assembly of an electrically conductive interlayer 14 embedded between two insulating layers 12 having a peripheral surface,
  (ii) a cover layer 16 covering a peripheral surface of the insulating layers 12 of the multi-layer substrate 10, and
  (iii) a microvia 20 extending from the peripheral surface of the multi-layer substrate 10 through the cover layer 16, 16a, 16b and ending on the conductive interlayer 14;

b1) depositing a conductive layer (30) on the cover layer 16 and on an inner surface of the microvia 20; and c) electrodepositing a copper filling 42 in the microvia 20 and a first copper layer 40 on the conductive layer 30, wherein a thickness of the first copper layer is from 0.1 to 3 µm and wherein the copper filling 42 and the first copper layer 40 form together a planar surface 32.

FIG. 2 illustrates a schematic sequence including cross sectional views of the method according to a second embodiment of the present invention. The inventive method of preparing a high density interconnect printed circuit board (HDI PCB) including microvias filled with copper according to the second embodiment comprises the steps of:

a2) providing a multi-layer substrate 10 comprising
  (i) a stack assembly of an electrically conductive interlayer 14 embedded between two insulating layers 12 having a peripheral surface,
  (ii) a microvia 20 extending from the peripheral surface of the insulating layers 12 of the multi-layer substrate 10 and ending on the conductive interlayer 14;

b2) depositing a conductive layer 30 on the peripheral surface of the insulating layers 12 of the multi-layer substrate 10 and on an inner surface of the microvia 20; and c) electrodepositing a copper filling 42 in the microvia 20 and a first copper layer 40 on the conductive layer 30, wherein a thickness of the first copper layer is from 0.1 to 3 µm and wherein the copper filling 42 and the first copper layer 40 form together a planar surface 32.

Thus, the first embodiment is distinguished form the second embodiment in the kind of multi-layer substrate 10 used for the processing. According to the first embodiment the conductive layer 30 is deposited on the cover layer 16, whereas according to the second embodiment the conductive layer 30 is directly deposited on the peripheral surface of the multi-layer substrate 10.

In steps a1) and a2) a multi-layer substrate 10 is provided, which in turn comprises at least two (electrically) insulating layers 12, one or more electrically conductive interlayers 14 embedded (directly) between the (electrically) insulating layers 12. The interlayers 14 thus forms an electrical path embedded into the multi-layer substrate 10. HDI PCBs may include several separate interlayers forming separate electric paths. The multi-layer substrate 10 according to the first embodiment further comprises an electrically conductive cover layer 16 covering the peripheral surface of the electrically insulating layer at the top 16a and bottom 16b of the multi-layer substrate 10. The conductive cover layer 16 may be disposed directly on an insulating layer 12 (on its peripheral surface). At least one microvia 20 extends from the peripheral surface of the multi-layer substrate 10—in case of the first embodiment through said conductive cover layer 16—and ends on the conductive interlayer 14. HDI PCBs may include several microvias.

The electrically conductive cover layer 16 according to the first embodiment is made of a conductive material, for example a metal or metal alloy, a conductive metal oxide (such as titan oxide), a carbon-based material (such as graphite, graphyne, and graphdiyne), a conductive polymer (such as Ecopact CP) or a conductive organic material. Preferably, the electrically conductive cover layer 16 is made of copper. Metal-containing layers may be deposited by for example chemical or auto-catalytic metal plating, physical vapour deposition (PVD) or chemical vapour deposition (CVD). In general, the multi-layer substrate 10 may be the starting material for a single-sided or double-sided high density interconnect printed circuit board. Hence, one or more microvias 20 may be drilled into of the multi-layer substrate 10. Thus, one or more microvias at one or both sides of the multi-layer substrate 10 may each extend from the peripheral surface of the multi-layer substrate 10 (according to the first embodiment through the cover layer 16) and ending on the conductive interlayer 14. The microvias 20 may be drilled into one or both sides of the multi-layer substrate 10, for instance by means of laser drilling.

Preferably, the microvias 20 may be drilled by means of laser drilling using an ultra short pulse laser (USP laser) or $CO_2$ laser. No other structures are formed within the insulating layers 12 of the multi-layer substrate 10.

In general, the microvia 20 may be defined by a microvia bottom and an inner wall, wherein the microvia bottom constitutes the electrically conductive interlayer 14, and the microvia bottom and the inner wall of the microvia constitute an inner surface of the microvia.

One or more microvias 20 may be drilled into one or both sides of the multi-layer substrate 10, thereby penetrating the cover layer 16 and at least one insulating layer 12, wherein the microvia 20 includes a microvia bottom and inner wall, the microvia bottom constitutes the electrically conductive interlayer 14, and the microvia bottom and the inner wall of the microvia 20 constitute an inner surface of the microvia 20.

A suitable electrically conductive cover layer 16 according to the first embodiment may be a laminated copper foil. Further, the electrically conductive cover layer 16 may have a layer thickness ranging from 0.01 to 5 µm, preferably 0.02 to 0.5 µm.

The conductive layer 30 in step b1) or b2) may be formed by electroless plating (electroless deposition) on the electrically conductive cover layer 16, respectively the on the peripheral surface of the multi-layer substrate 10 and the inner surface of the microvia 20, which is defined by the bottom and the inner wall of the microvia 20. The conductive layer 30 is applied to the cover layer 16 (first embodiment) or to the peripheral surface of the multi-layer substrate 10 (second embodiment) as well as the inner surface of the microvia 20 in order to provide a suitable conductive surface for the electrodeposition of the first copper layer 40 as well as the copper filling 42 in the microvia 20. The conductive layer 30 may be formed by one or more of an electroless plating process, an electroless deposition process, a physical deposition process, a chemical vapour deposition process, a plasma-enhanced chemical vapour deposition process or a depositing process for a conductive non-metallic layer.

The electrically conductive layer 30 is made of a conductive material, for example a metal or metal alloy, a conductive metal oxide (such as titan oxide), a carbon-based material (such as graphite, graphyne, and graphdiyne), a conductive polymer (such as Ecopact CP) or a conductive organic material. For example, the conductive layer 30 may be made of copper or platinum. The metal of the conductive layer 30 may comprise instead of or further other conductive metals such as gold, silver, palladium or aluminium. Metal-containing layers may be deposited by for example chemical or auto-catalytic metal plating, physical vapour deposition (PVD) or chemical vapour deposition (CVD).

Step c) of electrodepositing copper to form the copper filling 42 in the microvia 20 and the first copper layer 40 on the conductive layer 30 may include immersing the multi-layer substrate 10 into an electrolytic bath in an electrolytic copper plating system with the conductive layer 30 connected as a cathode. The plating system further comprises an insoluble dimensionally stable anode and a source of copper metal. The electrolytic bath comprises an acid, a source of copper ions, a source of $Fe^{2+}$ ions (ferrous ions) and/or $Fe^{3+}$ ions (ferric ions), and at least one additive for controlling physical-mechanical properties of deposited copper.

A thickness of the first copper layer is from 0.1 to 3 µm and the copper filling 42 and the first copper layer 40 form together a planar surface 32. In other words, there is no significant difference in heights between the peripheral surface of the copper filling 42 and the copper layer 40. The height difference between the peripheral surface of the copper filling 42 and the copper layer 40 is in particular less than 1 µm, more preferably less than 0.1 µm, most preferred less than 0.01 µm.

Subsequent to the immersing step c) an electrical voltage is applied between the insoluble dimensionally stable anode and the conductive layer 30, so that a current flows there between for a time sufficient to electrodeposit copper to form the copper filling 42 in the microvia 20 and the first copper layer 40, wherein a $Fe^{2+}/Fe^{3+}$ ion redox system is established in the electrolytic bath to provide additional copper ions to be electrodeposited by dissolving copper ions from the source of copper metal.

In other words, in step c) the copper filling 42 in the microvia 20 and the first copper layer 40 are deposited by a (first) electrodepositing process (electroplating) on the conductive layer 30.

The electrodepositing described in step c) may be performed by bringing in contact the processed multi-layer substrate 10 of step b1) or b2) and one or more insoluble dimensionally stable anodes with an electrolytic bath and applying an electrical voltage between the processed multi-layer substrate and the insoluble dimensionally stable anode. Thus, in this embodiment, the step of applying an electrical voltage between the insoluble dimensionally stable anode and the conductive layer so that a current flows there between is carried out for a time sufficient to electrodeposit copper to completely fill the microvia 20.

The source of copper ions may be a copper(II) salt, preferably selected from the group consisting of copper(II) sulfate, copper(II) sulfate pentahydrate, copper(II) sulfate heptahydrate, copper(II) methane sulfonate, copper(II) pyrophosphate, copper(II) fluoroborate and copper(II) sulfamate.

As noted above, Fe(II) and/or Fe(III) salts are contained in the bath. Suitable iron salts may be both the iron(II)-sulfate-heptahydrate and iron(II)-sulfate-nonahydrate, from either or both of which the effective $Fe^{2+}/Fe^{3+}$ (Fe(II)/Fe(III)) redox system is formed after a short operational time.

In another embodiment, the source of ferrous ions is a Fe(II) salt, preferably selected from the group consisting of iron(II) sulfate heptahydrate, iron(II) acetate, iron(II) propionate, iron(II) benzoate and iron(II) hexafluorosilicates.

According to another embodiment, the source of ferric ions is a Fe(III) salt, preferably selected from the group consisting of iron(III) sulfate nonahydrate, iron(III) acetate, iron(III) propionate, iron(III) benzoate and iron(III) hexafluorosilicates.

These salts are mainly suitable for aqueous, acidic copper baths. Other water-soluble iron salts may also be used, for example iron perchlorate. Salts which contain no (hard) complex formers are advantageous. Such complex formers may be biologically non-degradable or only may be degradable with some difficulty, thus such salts may create problems when disposing off-rinsing water (for example iron ammonium alum). Iron compounds having anions which lead to undesirable secondary reactions in the case of the copper deposition solution, such as chloride or nitrate for example, should not be used. In consequence, carboxylates of iron ions, such as acetate, propionate and benzoate, as well as the hexafluorosilicates, are also advantageous.

Suitable systems employing the $Fe^{2+}/Fe^{3+}$ ion redox system are disclosed, for example, in WO 2010/094998 A1, WO 2007/112971 A2, U.S. Pat. Nos. 5,976,341 and 6,099,711, which may be consulted for additional details on this system. The disclosures of the aforementioned patents relating to the use the $Fe^{2+}/Fe^{3+}$ ion redox system are incorporated herein by reference. Suitable additive compounds may be, for example, polymeric oxygen-containing compounds, organic sulfur compounds, thiourea compounds, polymeric phenazonium compounds and polymeric nitrogen compounds, and mixtures or combinations of any two or more of any of these additive compounds.

Suitable, exemplary, polymeric oxygen-containing compounds may comprise one or more of the following: carboxymethyl cellulose, nonylphenol-polyglycol ether, octanediol-bis-(polyalkyleneglycol ether), octanolpolyalkyleneglycol ether, oleic acid polyglycol ester, polyethylene-propyleneglycol copolymer polyethyleneglycol, polyethyleneglycol-dimethylether, polyoxypropyleneglycol, polypropyleneglycol, polyvinyl alcohol, stearic acid polyglycol ester, stearyl alcohol polyglycol ether and β-naphtol polyglycol ether.

Suitable, exemplary thiourea-type compounds may comprise one or more of the following: thiourea, N-acetylthiourea, N-trifluoroacetylthiourea, N-ethylthiourea, N-cyanoacetylthiourea, N-allylthiourea o-tolylthiourea, N,N'-butylene thiourea, thiazolidine thiol, 4-thiazoline thiol, imidazolidine thiol (N,N'-ethylene thiourea), 4-methyl-2-pyrimidine thiol, 2-thiouracil.

Suitable, exemplary phenazonium compounds may comprise one or more of the following: poly(6-methyl-7-dimethylamino-5-phenyl phenazonium sulfate), poly(2-methyl-7-diethylamino-5-phenyl phenazonium chloride), poly(2-methyl-7-dimethylamino-5-phenyl phenazonium sulfate), poly(5-methyl-7-dimethylamino phenazonium acetate), poly(2-methyl-7-anilino-5-phenyl phenazonium sulfate), poly(2-methyl-7-dimethylamino phenazonium sulfate), poly(7-methylamino-5-phenyl phenazonium acetate), poly(7-ethylamino-2,5-diphenyl phenazonium chloride), poly(2,8-dimethyl-7-diethylamino-5-p-tolyl-phenazonium chloride), poly(2,5,8-triphenyl-7-dimethylamino phenazonium sulfate), poly(2,8-dimethyl-7-amino-5-phenyl phenazonium sulfate) and poly(7-dimethylamino-5-phenyl phenazonium chloride).

Suitable, exemplary polymeric nitrogen-containing compounds may comprise one or more of the following: polyethylenimine, polyethylenimide, polyacrylic acid amide, polypropylenimine, N-polybutylenimine, N-methylpolyethylenimine, N-acetylpolyethylenimine and butylpolyethylenimine.

In principle, copper ions will be consumed during the electrodeposition process on the multilayer-substrate. However, in order to regain copper ions in the electrolyte bath, they cannot be directly supplied by the insoluble dimensionally stable anodes. Instead they will be provided by chemically dissolving a source of copper metal, i.e. a sacrificial anode made of copper or copper-containing shaped bodies. The dissolving of the source of copper metal may be realized and/or controlled in a secondary reactor and the electrodeposition may be realized and/or controlled in a primary reactor, with both reactors connected. The secondary reactor may be connected with a primary reactor in order to provide a circulation of the electrolyte bath between the secondary and primary reactor in an appropriate flow rate.

In this redox system, copper ions are formed from the source of copper metal (sacrificial anode or copper-containing shaped bodies) in a redox reaction with dissolved Fe(III) salts as oxidizing agent. In other words, the Fe(III) ions are reduced to Fe(II) ions, whereas the source copper metal being oxidized to form Cu(II) ions. By means of this redox reaction, the total concentration of the copper ions needed for the electrodeposition process is kept relatively constant in the electrolyte bath. Further, the insoluble dimensionally stable anodes, on which the actual voltage is applied, remain the same uniform size. As will be recognized, the following reactions take place:

At the insoluble dimensionally stable anodes (electrodeposition process):

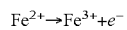
$$Fe^{2+} \rightarrow Fe^{3+} + e^-$$

At the cathode, i.e. at the multi-layer substrate (electrodeposition process):

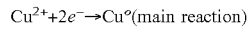
$$Cu^{2+} + 2e^- \rightarrow Cu^\circ \text{(main reaction)}$$

$$Fe^{3+} + e^- \rightarrow Fe^{2+} \text{(minor reaction)}$$

At the source of copper metal (electroless regain of $Cu^{2+}$):

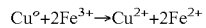
$$Cu^\circ + 2Fe^{3+} \rightarrow Cu^{2+} + 2Fe^{2+}$$

In another embodiment, the electrical voltage is applied in a reverse pulse form with bipolar pulses including a forward current pulse and a reverse current pulse.

When applying the voltage to the substrate, the local current density diverges between areas with vias (so called high hole density areas, HHD areas) and without vias as well as it depends on the hole-density of the vias in a particular area. HHD areas typically have a lower local current density compared to areas without vias. Further, the higher the hole-density of the vias, the lower the local current density. In that context, a HHD surface factor for a particular area of a substrate is defined as ratio between the total surface including the inner surfaces of all vias (also called total grid area) and the peripheral surface of the corresponding area (also called grid surface). The higher the HHD surface factor, the more vias, respectively, the smaller the hole pitch (distance between via-midpoints), smaller the diameter of the via and the lower the current density.

In the electrodeposition process described above, the local current efficiency, i.e. the efficiency with which electrons are transferred in a system facilitating an electrochemical reaction (here the deposition of copper), correlates to the local current density. Therefore, the higher the HHD surface factor, the lower the local current density, the lower the local current efficiency, i.e. the smaller the layer thickness from the copper deposition.

In the redox system described above, the local current efficiency further depends on the $Fe^{3+}$ concentration in the electrolytic bath, i.e. the higher the $Fe^{3+}$ concentration, the smaller the thickness of the deposited copper layer.

Further, in the redox system described above, the local current efficiency depends on the temperature, i.e. the higher the temperature, the smaller the thickness of the deposited copper layer.

Further, in the redox system described above, the local current efficiency depends on the duration of the reverse current pulse, i.e. the longer the duration of the reverse current pulse, the smaller the thickness of the deposited copper layer.

In another embodiment, the electrical voltage is applied in a reverse pulse form with bipolar pulses including a forward current pulse and a reverse current pulse.

In another embodiment, the local current efficiency is controlled by adjusting at least one of the concentration of the source of copper ions, the concentration of the source of ferrous ions, the concentration of the source of ferric ions, the duration of the reverse current pulse and the temperature of the electrolytic bath. Preferably, the local current efficiency is controlled by adjusting at least one of the concentrations of the source of ferric ions, the duration of the reverse current pulse, and the temperature of the electrolytic bath.

In particular, the current efficiency drops if the concentration of ferrous ions and/or the temperature of the electrolytic bath is increased. Furthermore, the current efficiency also drops if the duration of the reverse pulse is shortened. On the other hand, the current efficiency increases along with an increase of copper(II) ion concentration.

In another embodiment, the electrolytic bath comprises the source of copper ions at a concentration in the range from 20 to 150 g/l, and/or the source of ferrous ions at a concentration in the range from 1 to 40 g/l, and/or the source of ferric ions at a concentration in the range from 0.1 to 40 g/l.

The duration of the reverse current pulse may be adjusted in the range of 0 to 200 milliseconds. Further, the duration of the forward current pulse may be adjusted in the range of 0 to 200 milliseconds.

In another embodiment of the invention, step c) is followed by:
step d), forming a patterned masking film 50 on the first copper layer 40;
step e), electrodepositing a second copper layer 60 in the area not covered by the patterned masking film 50; and
step f) removing the patterned masking film 50.

In other words, step d) may comprise disposing and curing, or laminating a patterned masking film 50 on parts of the first copper layer 40. The aim of step d) is to avoid electrodepositing of the second copper layer 60 in the areas covered by the patterned masking film 50. The patterned masking film 50 may be, for example, a photoresist.

Step e) comprises performing a (second) electrodepositing (electroplating) of the second copper layer 60 by bringing in contact the processed multi-layer substrate 10 of step d) and one or more insoluble dimensionally stable anodes with the electrolytic bath, and applying an electrical voltage between the processed multi-layer substrate 10 and the anode. The electrodeposition is carried out for a time sufficient for a uniform distribution of electrodeposited copper.

Step f) may comprise any appropriate method known in the art for removing the patterned masking film 50, for example by applying an organic solvent and dissolving the patterned masking film 50.

Step f) may be followed by step g1) of (differential) etching the peripheral surface of the processed multi-layer substrate 10 for an etching time sufficient to completely remove the cover layer 16, 16a, 16b, the conductive layer 30, and the first copper layer 40 in the areas, which were covered by the masking film 50 in step d) (first embodiment). In case of the second embodiment, step f) may be followed by step g2) of (differential) etching the peripheral surface of the processed multi-layer substrate 10 for an etching time sufficient to completely remove the first copper layer 40 and the conductive layer 30 in the areas, which were covered by the masking film 50 in step d).

In other words, the method may comprise subsequent to step f) an etching step g1) respectively g2), in which the processed multi-layer substrate of step f) is brought in contact with an etching solution within a contact time, which is suitable to completely remove the freely accessible first copper layer 40, the subjacent conductive layer 30 and the subjacent cover layer 16. Thus, FIG. 1 is a schematic sequence including cross sectional views of each step a1) to g1) of the method according to the first embodiment of the present invention. The illustrated exemplary method sequence comprises: step a1) providing a multi-layer substrate 10 including microvias 20 and a copper clad as cover layers 16a, 16b on both sides of the multi-layer substrate 10. Each of the microvias 20 ends at a conductive interlayer 14;

step b1) depositing a conductive layer 30 on the cover layer 16a, 16b of the copper clad substrate 10 and an inner surface of the microvia 20, for example by electroless plating;

step c) electrodepositing a copper filling 42 in the microvia 20 and a first copper layer 40 on the conductive layer 30;

step d) forming a patterned masking film 50 on the first copper layer 40;

step e) electrodepositing a second copper layer 60 in the area not covered by the masking film 50;

step f) removing the masking film 50; and step g1) etching the peripheral surface of the processed multi-layer substrate 10 for an etching time sufficient so that the freely accessible areas of cover layer 16 are completely removed.

FIG. 2 shows a schematic sequence including cross sectional views of each step a2) to g2) of the method according to the second embodiment of the present invention. The illustrated exemplary method sequence comprises:

step a2) providing a multi-layer substrate 10 including microvias 20 on both sides of the multi-layer substrate 10. Each of the microvias 20 ends at a conductive interlayer 14;

step b2) depositing a conductive layer 30 on the peripheral surface of the multi-layer substrate 10 and on an inner surface of the microvia 20, for example by electroless plating;

step c) electrodepositing a copper filling 42 in the microvia 20 and a first copper layer 40 on the conductive layer 30;

step d) forming a patterned masking film 50 on the first copper layer 40;

step e) electrodepositing a second copper layer 60 in the area not covered by the masking film 50;

step f) removing the masking film 50; and step g1) etching the peripheral surface of the processed multi-layer substrate 10 for an etching time sufficient such that the first copper layer 40 and the conductive layer 30 in the areas, which were covered by the masking film 50 are completely removed.

The method according to the present disclosure has the advantage that the copper thickness variation between the outer-end-surface of the microvia and the patterned copper surfaces is minimized. Furthermore, the overall small layer thickness of the patterned copper surface, reduces the etching time for trace-to-trace separation and therefore minimizes risks of detrimental width narrowing or undercut etching.

REFERENCE SIGNS

10 multi-layer substrate
12 insulating layers
14 electrically conductive interlayer
16, 16a, 16b cover layer
20 microvia
30 conductive layer
32 planar surface
40 first copper layer
50 patterned masking film
60 second copper layer

The invention claimed is:

1. A method of preparing a high density interconnect printed circuit board (HDI PCB) including microvias filled with copper, the method comprising the steps of:
　a2) providing a multi-layer substrate (10) comprising
　　(i) a stack assembly of an electrically conductive interlayer (14) embedded between two insulating layers (12) having a peripheral surface,
　　(ii) a microvia (20) extending from the peripheral surface of the insulating layers (12) of the multi-layer substrate (10) and ending on the conductive interlayer (14);
　b2) depositing a conductive layer (30) on the peripheral surface of the insulating layers (12) of the multi-layer substrate (10) and on an inner surface of the microvia (20);
　c) electrodepositing a copper filling (42) in the microvia (20) and a first copper layer (40) on the conductive layer (30) wherein a thickness of the first copper layer (40) is from 0.1 to 3 μm and wherein the copper filling (42) and the first copper layer (40) form together a planar surface (32);
　and, subsequent to step c):
　d) forming a patterned masking film (50) on the first copper layer (40);
　e) electrodepositing a second copper layer (60) in the area not covered by the patterned masking film (50); and
　f) removing the patterned masking film (50).

2. The method of claim 1, further comprising subsequent to step f):
　g2) etching the peripheral surface of the processed multi-layer substrate (10) provided under a2) and b2) for an etching time sufficient to completely remove the first copper layer (40) and the conductive layer (30) in the areas, which were covered by the masking film (50) in step d).

3. The method of claim 1, wherein the conductive layer (30) of step b2) is an organic conductive layer (30), a carbon-based material layer or a conductive metal oxide layer (30).

4. The method of claim 1, wherein step c) of electrodepositing copper to form the copper filling (42) in the microvia (20) and the first copper layer (40) on the conductive layer (30) includes immersing the multi-layer substrate (10) into an electrolytic bath in an electrolytic copper plating system with the conductive layer (30) connected as a cathode, the plating system further comprising an insoluble dimensionally stable anode and a source of copper metal, wherein the electrolytic bath comprises an acid, a source of copper ions, a source of $Fe^{2+}$ and/or $Fe^{3+}$ ions, and at least one additive for controlling physical-mechanical properties of deposited copper; and
　applying an electrical voltage between the insoluble dimensionally stable anode and the conductive layer (30), so that a current flows there between for a time sufficient to electrodeposit copper to form the copper filling (42) in the microvia (20) and the first copper layer (40), wherein a $Fe^{2+}/Fe^{3+}$ redox system is established in the electrolytic bath to provide additional copper ions to be electrodeposited by dissolving copper ions from the source of copper metal.

5. The method of claim 4, wherein the source of copper ions is a copper(II) salt, selected from the group consisting of copper(II) sulfate, copper(II) sulfate pentahydrate, copper (II) sulfate heptahydrate, copper(II) methane sulfonate, copper(II) pyrophosphate, copper(II) fluoroborate, and copper (II) sulfamate.

6. The method of claim 4, wherein the source of ferrous ions is a Fe(II) salt, selected from the group consisting of iron(II) sulfate heptahydrate, iron(II) acetate, iron(II) propionate, iron(II) benzoate, and iron(II) hexafluorosilicates.

7. The method of claim 4, wherein the source of ferric ions comprises Fe(III) salts, selected from the group consisting of iron(III) sulfate nonahydrate, iron(III) acetate, iron(III) propionate, iron(III) benzoate, and iron(III) hexafluorosilicates.

8. The method of claim 4, wherein the electrical voltage is applied in a reverse pulse form with bipolar pulses including a forward current pulse and a reverse current pulse.

9. The method of claim 4, wherein local current efficiency is controlled by adjusting at least one of
　the concentration of the source of copper ions,
　the concentration of the source of ferrous ions,
　the concentration of the source of ferric ions,
　the duration of the reverse current pulse and
　the temperature of the electrolytic bath.

10. The method of claim 9, wherein the electrolytic bath comprises
　the source of copper ions at a concentration in the range from 20 to 150 g/l, and/or
　the source of ferrous ions at a concentration in the range from 1 to 40 g/l, and/or
　the source of ferric ions at a concentration in the range from 0.1 to 40 g/l.

11. The method of claim 9, wherein the duration of the reverse current pulse is adjusted in the range from 0 to 200 ms milliseconds.

12. The method of claim 1, wherein in a2) (ii) no other structures to be filled extend from the peripheral surface of the insulating layers (12) of the multi-layer substrate (10).

13. The method of claim 1, wherein a height difference of the formed planar surface in step c) between the copper filling (42) and the first copper layer (40) is less than 30% or less than 10% or from 10% to 30%.

\* \* \* \* \*